United States Patent
Rigney et al.

(10) Patent No.: US 6,492,038 B1
(45) Date of Patent: Dec. 10, 2002

(54) THERMALLY-STABILIZED THERMAL BARRIER COATING AND PROCESS THEREFOR

(75) Inventors: Joseph David Rigney, Milford, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 50 days.

(21) Appl. No.: 09/723,273

(22) Filed: Nov. 27, 2000

(51) Int. Cl.7 .............................. B32B 15/04; F03B 3/12
(52) U.S. Cl. ....................... 428/627; 428/469; 428/632; 428/698; 428/699; 428/701; 428/702; 428/304.4; 428/317.9
(58) Field of Search .................. 428/698, 699, 428/701, 702, 469, 627, 632, 168, 304.4, 314.2, 317.9; 416/241 R, 241 B

(56) References Cited

U.S. PATENT DOCUMENTS

| 4,112,137 A | 9/1978 | Zega |
| 4,774,150 A | 9/1988 | Amano et al. |
| 4,996,117 A | 2/1991 | Chu et al. |
| 5,296,274 A | 3/1994 | Movchan et al. |
| 5,418,003 A | 5/1995 | Bruce et al. |
| 5,474,809 A | 12/1995 | Skelly et al. |
| 5,512,382 A | 4/1996 | Strangman |
| 5,562,998 A | 10/1996 | Strangman |
| 5,683,825 A | 11/1997 | Bruce et al. ................ 428/698 |
| 5,773,078 A | 6/1998 | Skelly |
| 5,834,070 A | 11/1998 | Movchan et al. |
| 5,906,895 A | 5/1999 | Hamada et al. |
| 6,042,951 A * | 3/2000 | Kojima et al. |
| 6,294,260 B1 * | 9/2001 | Subramanian |

* cited by examiner

Primary Examiner—Deborah Jones
Assistant Examiner—Jennifer McNeil
(74) Attorney, Agent, or Firm—David L. Narciso; Gary M. Hartman; Domenica N. S. Hartman

(57) ABSTRACT

A thermal barrier coating (TBC) and method for forming the coating on a component intended for use in a hostile environment. The coating and method are particularly directed to inhibiting sintering, grain coarsening/growth and pore redistribution in the coating during high temperature excursions by providing limited amounts of extremely fine carbide-based and/or nitride-based precipitates preferably formed at defects and pores at and between the grain boundaries of the TBC microstructure. The precipitates pin the TBC grain boundaries and pores during high temperature excursions, with the effect that the TBC microstructure is thermally stabilized. A coating containing the carbides and/or nitrides can be formed using a physical vapor deposition technique in an atmosphere that contains carbon and/or nitride gases or compounds thereof, or by evaporating a source material that contains carbon, carbon-containing compounds, carbides and/or nitrides.

12 Claims, 2 Drawing Sheets

THERMALLY-STABILIZED THERMAL BARRIER COATING AND PROCESS THEREFOR

FIELD OF THE INVENTION

This invention relates to protective coatings for components exposed to high temperatures, such as the hostile thermal environment of a gas turbine engine. More particularly, this invention is directed to a method of stabilizing the microstructure of a thermal barrier coating (TBC) with carbide and/or nitride-based precipitates in order to inhibit degradation of the thermal insulating properties of the TBC during high temperature excursions.

BACKGROUND OF THE INVENTION

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack and may not retain adequate mechanical properties. For this reason, these components are often protected by a thermal barrier coating (TBC) system. TBC systems typically include an environmentally-protective bond coat and a thermal-insulating ceramic topcoat, typically referred to as the TBC. Bond coat materials widely used in TBC systems include oxidation-resistant overlay coatings such as MCrAlX (where M is iron, cobalt and/or nickel, and X is yttrium or another rare earth element), and oxidation-resistant diffusion coatings such as diffusion aluminides that contain aluminum intermetallics.

Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques. TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

In order for a columnar TBC to remain effective throughout the planned life cycle of the component it protects, it is important that the TBC maintains a low thermal conductivity throughout the life of the component. However, the thermal conductivities of TBC materials such as YSZ are known to increase over time when subjected to the operating environment of a gas turbine engine. As a result, TBC's for gas turbine engine components are often deposited to a greater thickness than would otherwise be necessary. Alternatively, internally cooled components such as blades and nozzles must be designed to have higher cooling flow. Both of these solutions are undesirable for reasons relating to cost, component life and engine efficiency.

In view of the above, it can be appreciated that further improvements in TBC technology are desirable, particularly as TBC's are employed to thermally insulate components intended for more demanding engine designs.

BRIEF SUMMARY OF THE INVENTION

The present invention generally provides a thermal barrier coating (TBC) and method for forming the coating on a component intended for use in a hostile environment, such as the superalloy turbine, combustor and augmentor components of a gas turbine engine. The coating and method are particularly directed to inhibiting grain growth, sintering and pore coarsening or coalescence in the TBC during high temperature excursions. Improvements obtained by this invention are particularly evident with TBC having a columnar grain structure, such as those deposited by EBPVD and other PVD techniques, though the invention is also applicable to TBC deposited by such methods as plasma spraying.

In TBC's having a columnar grain structure, heat transfer through the TBC is primarily by conduction through the individual columnar grains. According to the invention, resistance to heat transfer through the TBC is believed to be enhanced by microstructural defects within the grains created by composition-induced defect reactions and process-induced porosity. As used herein, composition-induced defect reactions include vacancies that result from the need in ionic solids to maintain charge neutrality, as is the case in YSZ where substitution of zirconia ($ZrO_2$) with yttria ($Y_2O_3$) in the lattice yields a vacancy. These lattice defects cannot be controlled through microstructural manipulation, as the atomic defects are based solely on thermodynamics and are not process-dependent. Therefore, compositional changes (substitutional changes that affect defect reactions) are the only way to affect the concentration of this type of defect. Process-induced porosity includes pore formation that occurs as a component being coated is rotated relative to the deposition source. A primary example is the "sunrise-sunset" vapor-surface mechanisms that occur during rotation of a component during deposition of TBC from a vapor cloud, such as by PVD, the result of which is a textured growth of the deposit in which pores are formed between columns, within the columns, and between secondary growth arms contained within the columns. In order for a columnar TBC to maintain a low thermal conductivity throughout the life of the component it protects, process-induced porosity must be preserved to stabilize the associated microstructural defects. However, microstructures of TBC materials such as YSZ have been found to sinter, coarsen and undergo pore redistribution (as used herein, when smaller pores coalesce or coarsen to form larger pores) during high temperature exposures, such as temperatures in excess of 1000° C. found within the hot gas path of a gas turbine engine. As a result, increases in thermal conductivity noted for TBC materials on gas turbine engine components can be attributed to sintering, grain coarsening and pore redistribution.

As a solution, this invention inhibits TBC grain growth and pore redistribution with limited amounts of extremely fine carbide-based and/or nitride-based precipitates formed at the defects and pores of the TBC microstructure, as well as on the grain boundaries of the TBC. Preferred carbide and nitride-based precipitates include metal carbides and nitrides, oxycarbides and carbonitrides. The precipitates are for the purpose of pinning the TBC grain boundaries to inhibit sintering, grain coarsening and pore redistribution within the TBC microstructure during high temperature excursions, with the effect that the microstructure, and consequently the thermal conductivity of the TBC, is stabilized. To be effective, the precipitates must be smaller than the pores intended to be stabilized, which are typically on the order of about fifty nanometers up to about one or two micrometers. In addition, the volume fraction of the precipitates is preferably on the order of about three to twenty-five volume percent. The lower volume limit is the minimum amount of precipitates that is believed would have any significant effect, while the upper limit corresponds to the approximate volume attributable to pores within the TBC microstructure, e.g., formed by process-induced porosity.

A suitable method for carbiding/nitriding the TBC microstructure is to deposit the TBC using a physical vapor deposition technique in an atmosphere that contains carbon and/or nitride gases or compounds thereof, depending on whether precipitates of carbides, nitrides or both are desired. In this manner, the TBC and the desired precipitates are simultaneously formed. An additional and optional step is to heat treat the component in the presence of a gas containing carbon and/or nitrogen gases or compounds thereof to form an additional amount of precipitates in the TBC.

By sufficiently stabilizing the TBC microstructure and pinning grain boundaries with carbide and/or nitride precipitates, the component can be subsequently heated to temperatures in excess of 1200° C. without causing sintering, grain coarsening and pore redistribution of the microstructure. As a result, components can be designed for thinner TBC and/or, where applicable, lower cooling air flow rates, which reduces processing and material costs and promotes component life and engine efficiency.

Other objects and advantages of this invention will be better appreciated from the following detailed description.

DETAILED DESCRIPTION OF THE INVENTION

Figure 1:
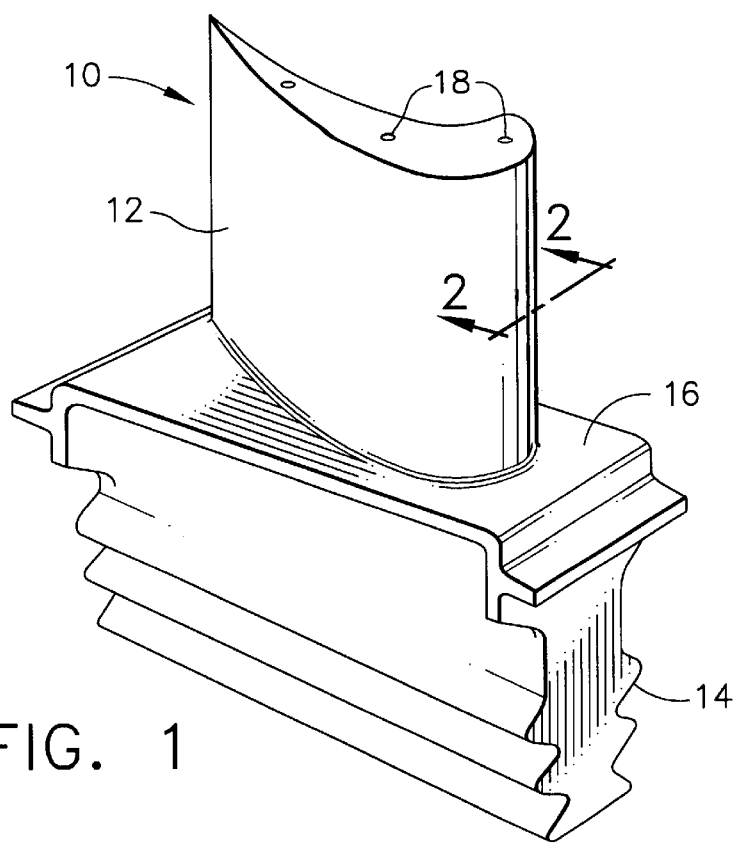
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
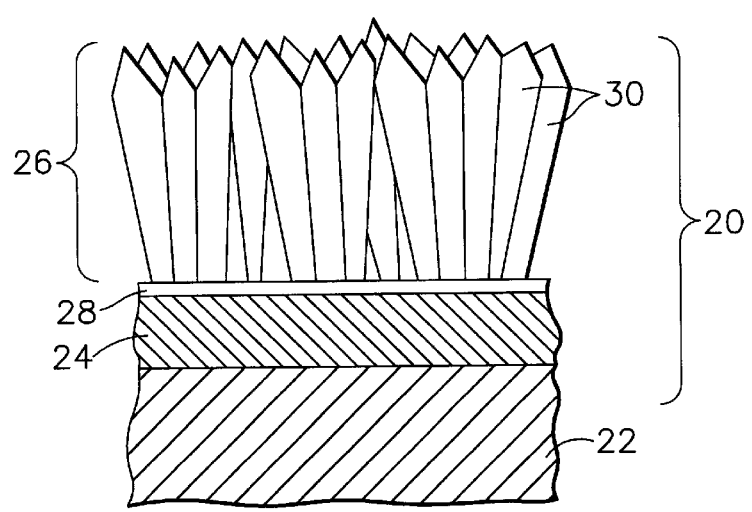
FIG. 2 is a cross-sectional view of the blade of FIG. 1 along line 2—2, and shows a thermal barrier coating system on the blade in accordance with a first embodiment of this invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a thermal-insulating ceramic layer, or TBC 26, to the bond coat 24 and substrate 22. The TBC 26 of FIG. 2 is represented as having a strain-tolerant microstructure of columnar grains 30, one of which is represented in greater detail in FIG. 4. As known in the art, such columnar microstructures can be achieved by depositing the TBC 26 using a physical vapor deposition technique, such as EBPVD. A preferred material for the TBC 26 is an yttria-stabilized zirconia (YSZ), a preferred composition being about 4 to about 20 weight percent yttria, though other ceramic materials could be used, such as zirconia fully stabilized by yttria, nonstabilized zirconia, or zirconia partially or fully stabilized by magnesia, ceria, scandia or other oxides. The TBC 26 is deposited to a thickness that is sufficient to provide the required thermal protection for the underlying substrate 22 and blade 10, generally on the order of about 75 to about 300 micrometers.

Figure 3:
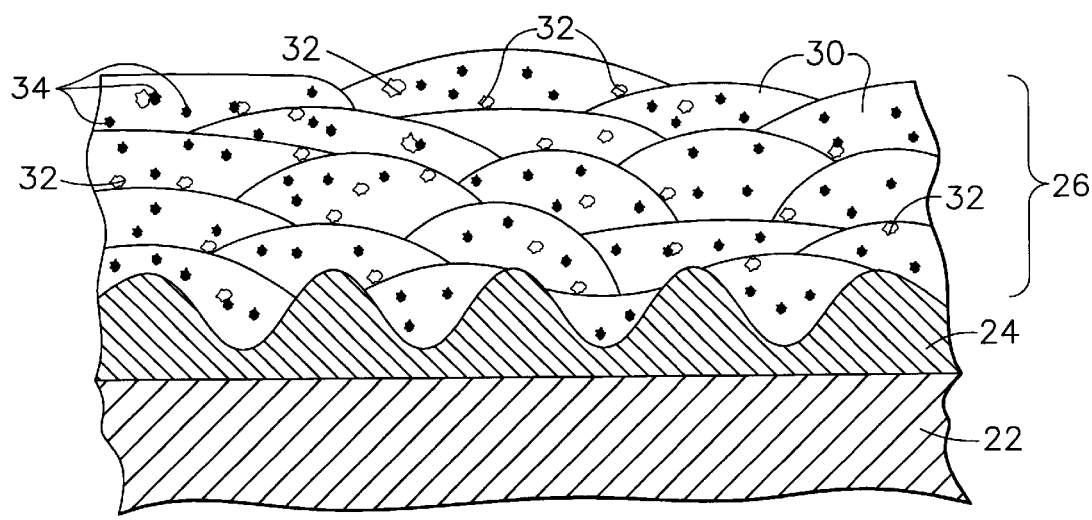
FIG. 3 is a cross-sectional view of a thermal barrier coating system in accordance with a second embodiment of this invention.
Figure 4:
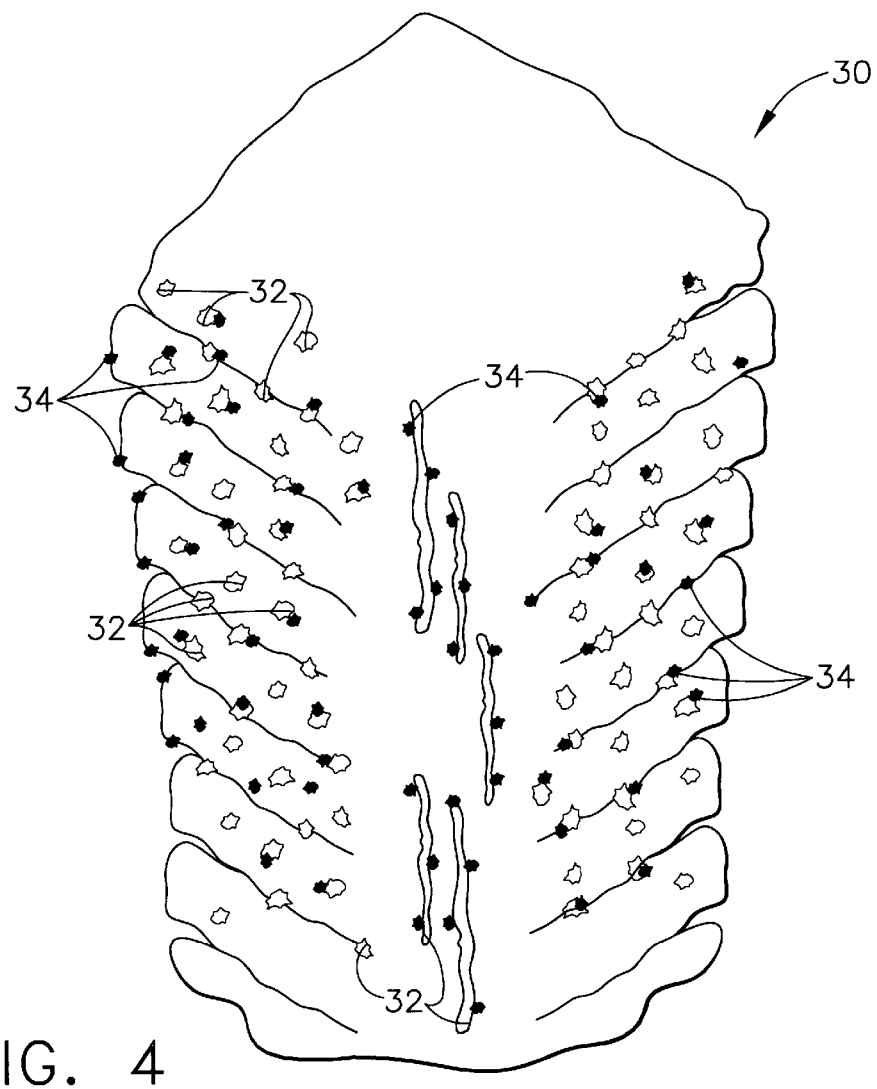
FIG. 4 is a detailed representation of a columnar grain of the thermal barrier coating of FIG. 2.

While much of the following discussion will focus on columnar TBC of the type shown in FIGS. 2 and 4, the invention is also believed to be applicable to noncolumnar TBC deposited by such methods as plasma spraying, including air plasma spraying (APS). The microstructure of this type of TBC is represented in FIG. 3, in which the same reference numbers used in FIG. 2 to identify the columnar TBC 26 on a substrate 22 and bond coat 24 are now used to identify a similar substrate 22 and bond coat 24 on which a noncolumnar TBC 26 was deposited by plasma spraying. In the plasma spraying process, TBC material is deposited in the form of molten "splats," resulting in the plasma-sprayed TBC 26 of FIG. 3 having a microstructure characterized by irregular flattened grains 30 and a degree of inhomogeneity and porosity.

As a result of the processes by which the TBC's 26 of FIGS. 2 through 4 are deposited, the individual grains 30 of the TBC's 26 are characterized by microstructural defects and pores 32 within the grains 30 and at and between the grain boundaries. The defects and pores 32 are believed to decrease the thermal conductivity of a TBC grain 30, and therefore the TBC 26 as a whole. Because grain growth, sintering and pore redistribution within the TBC 26 during a high temperature excursion tends to coarsen and/or eliminate the defects and pores 32, the present invention provides for stabilization of the TBC microstructure by forming fine precipitates 34 that anchor and pin the grain boundaries and pores 32 of the TBC 26, thus preventing grain growth and pore redistribution (coalescing) that would increase the thermal conductivity of the TBC 26. The precipitates 34 are preferably nonmetallic phases which decorate the exterior of the TBC grain 30 as shown in FIGS. 3 and 4, and are potentially embedded within the grains 30. Preferred precipitates 34 are carbides, oxycarbides, nitrides, carbonitrides or mixtures thereof, which advantageously leave pores if caused to decompose by oxidation when subjected to high operating temperatures of a gas turbine engine.

To be effective, it is believed that the TBC 26 must contain at least three volume percent of the precipitates 34 without interfering with the desired strain-tolerance of the TBC 26. For this same reason, the precipitates 34 must be sufficiently fine to fit within the pores 32, yet sufficiently large to be capable of pinning the grain boundaries and pores 32 of the TBC 26. An upper size limit is believed to be the thickness of one of the individual layers of TBC material that successively form during the deposition process, typically on the order of about one to two micrometers. In view of the above, a suitable particle size and volume fraction for the precipitates 34 within the TBC 26 is about 50 to about 2000 nanometers and about three to about twenty-five volume percent, respectively. More preferably, the TBC 26 contains about three to about ten volume percent of the precipitates 34, which have diameters on the order of about 50 to about 500 nanometers.

Suitable processes for forming the TBC's 26 of FIGS. 2 and 3 generally entail depositing a suitable TBC material in the presence of a carbon and/or nitrogen-containing gas which serves as the source of the carbide-based and/or nitride-based precipitates 34. Suitable gases for this purpose will depend on the particular coating process, but generally include methane, benzene and toluene as carbon sources, and nitrogen gas or ammonia as nitrogen sources. As an example, in the past the process of depositing TBC and other ceramic coatings by EBPVD has generally entailed loading component(s) to be coated into a coating chamber, evacuating the chamber, and then backfilling the chamber with oxygen and an inert gas such as argon to achieve a subatmospheric chamber pressure of typically about 0.005 mbar or higher. The component would be supported in proximity to an ingot of the desired coating material, and an electron beam projected onto the ingot so as to melt the surface of the ingot and produce a vapor of the TBC material that deposits (condenses) on the component surface. While similar in many other respects, the process for depositing the columnar TBC 26 of FIG. 2 differs by the introduction of a carbon and/or nitrogen-containing gas into the coating chamber during the coating process. The high-temperature evaporation of the TBC material in the presence of the carbon and/or nitrogen-containing gas(es) results in the simultaneous formation of the precipitates 34 at the defects and pores 32 of the TBC microstructure during growth of the individual grains 30. The amount and, if applicable, relative proportions of the precipitates 34 can be controlled through adjusting the partial pressure of the carbon and/or nitrogen-containing gas(es) within the coating chamber. Suitable partial pressures are believed to be about 0.001 to about 0.006 mbar, or about 10% to about 50% of the gaseous atmosphere with the coating chamber. Alternatively, the TBC ingot material could be altered to contain carbon, a carbon-containing compound, or a carbide or nitride. The placement of the precipitates 34 within the TBC 26 can also be controlled by limiting the introduction of the carbon and/or nitrogen-containing gas(es) to certain periods of the deposition process. A preferred process is believed to entail limiting the flow of the carbon and/or nitrogen-containing gas(es) to after deposition has been initiated so that precipitates 34 are not deposited directly on the surface of the surface being coated, e.g., the bond coat 24, in order to not interfere with the formation of the alumina scale 28 and the chemical bond between the scale 28 and the TBC 26. For this purpose, the first five to ten micrometers of deposited TBC 26 could be free of precipitates 34.

An additional and optional step is to heat treat the TBC-coated blade 10 in the presence of a carbon-containing and/or nitrogen-containing gas to form an additional amount of the precipitates 34. The same gas or gases as those used during deposition of the TBC 26 can be used, with minimum heat treatment temperatures being dependent on the gas(es) used and maximum heat treatment temperatures being dependent on the substrate material of the blade 10. A suitable treatment is believed to be about 900° C. to about 1100° C. for a duration of about 0.5 to about 10 hours. Another optional heat treatment is to expose the TBC 26 to an oxidizing atmosphere at about 900° C. to about 1150° C. for a duration of about 0.5 to about 2 hours to purposely decompose the carbide-based and/or nitride-based precipitates 34, the result of which is the formation of additional pores within the TBC microstructure and lower thermal conductivity of the TBC 26.

While the invention has been described in terms of a preferred embodiment, it is apparent that other forms could be adopted by one skilled in the art. For example, instead of depositing the TBC 26 by EBPVD, other atomic and molecular vapor deposition processes could be used, such as sputtering, ion plasma deposition, and all forms of melting and evaporation deposition processes. Accordingly, the scope of the invention is to be limited only by the following claims.

What is claimed is:

1. A component having a thermal barrier coating on a surface thereof, the thermal barrier coating having a microstructure with process-induced defects and pores at and between grain boundaries of the microstructure, the thermal barrier coating containing carbide-based and/or nitride-based precipitates at the grain boundaries and the defects and pores in an amount sufficient to inhibit sintering, grain coarsening and pore redistribution of the microstructure and thereby thermally stabilize the microstructure, the precipitates being sufficiently fine to fit within the defects and pores.

2. A component according to claim 1, wherein the microstructure of the thermal barrier coating consists of columnar grains so that the microstructure is columnar, or flattened grains so that the microstructure is noncolumnar and inhomogeneous.

3. A component according to claim 1, wherein the thermal barrier coating is predominantly yttria-stabilized zirconia.

4. A component according to claim 1, wherein the component is formed of a superalloy.

5. A component according to claim 1, wherein the precipitates are chosen from the group consisting of carbides, oxycarbides and carbonitrides.

6. A component according to claim 1, wherein the precipitates are chosen from the group consisting of nitrides and carbonitrides.

7. A component according to claim 1, wherein the precipitates are present in the thermal barrier coating at a level of about 3 to about 25 volume percent.

8. A component according to claim 1, wherein a portion of the thermal barrier coating adjacent the surface of the component is free of the precipitates.

9. A component according to claim 1, wherein the precipitates have diameters in a range of about 50 to about 2000 nanometers.

10. A gas turbine engine component comprising:
a superalloy substrate;

a metallic bond coat on a surface of the substrate; and a thermal barrier coating of yttria-stabilized zirconia on the bond coat the thermal barrier coating having a columnar microstructure with process-induced defects and pores at and between grain boundaries of the microstructure, the thermal barrier coating containing about 3 to about 25 volume percent of precipitates chosen from the group consisting of carbides, oxycarbides, nitrides and carbonitrides, the precipitates having diameters of about 50 to about 2000 nanometers and being present at the grain boundaries and within the defects and pores in an amount sufficient to inhibit sintering, grain coarsening and pore redistribution of the microstructure and thereby thermally stabilize the microstructure.

11. A gas turbine engine component according to claim 10, wherein the precipitates are present in the thermal barrier coating at a level of about 3 to about 10 volume percent, and have diameters in a range of about 50 to about 500 nanometers.

12. A gas turbine engine component according to claim 10, wherein a portion of the thermal barrier coating adjacent the surface of the component is free of the precipitates.

* * * * *